United States Patent [19]

Shibuya et al.

[11] Patent Number: 4,619,508
[45] Date of Patent: Oct. 28, 1986

[54] ILLUMINATION OPTICAL ARRANGEMENT

[75] Inventors: Masato Shibuya, Ohmiya; Makoto Uehara, Tokyo, both of Japan

[73] Assignee: Nippon Kogaku K. K., Tokyo, Japan

[21] Appl. No.: 726,232

[22] Filed: Apr. 23, 1985

[30] Foreign Application Priority Data

Apr. 28, 1984 [JP] Japan .................................. 59-86669
Jan. 22, 1985 [JP] Japan .................................. 60-9653

[51] Int. Cl.⁴ .......................... F21V 7/04; G03B 27/54
[52] U.S. Cl. ...................................... 353/122; 353/85; 353/38; 355/67; 362/268
[58] Field of Search ............... 353/122, 121, 102, 38, 353/85; 362/268; 355/53, 67

[56] References Cited

U.S. PATENT DOCUMENTS 3,302,016  1/1967  Larraburu ........................ 353/38 X
4,497,013  1/1985  Ohta .............................. 362/268 X
4,497,015  1/1985  Konno et al. ..................... 353/38 X

OTHER PUBLICATIONS

Max Born and Emil Wolf, *Principles of Optics*, (fourth edition), 7.5.8. (pp. 316–323), Pergamon Press, Oxford, 1970.

*Primary Examiner*—Harry N. Haroian
*Attorney, Agent, or Firm*—Shapiro and Shapiro

[57] ABSTRACT

An illumination optical arrangement comprises light source means emitting a coherent light beam, and means for forming a substantially incoherent light source from the coherent light beam. The incoherent light source forming means includes means for periodically deflecting the coherent light beam and scanning a predetermined scanning area by the coherent light beam, and optical means for forming a plurality of optical paths for directing the coherent light beam passed through the predetermined scanning area to a plurality of different secondary scanning areas. Each of the plurality of secondary scanning areas is scanned by the periodically deflected coherent light beam.

12 Claims, 16 Drawing Figures

FIG. 11
|    |    |    |    |    |    |    |    |
|----|----|----|----|----|----|----|----|
| 29 | 37 | 21 | 45 | 13 | 53 | 5  | 61 |
| 36 | 28 | 44 | 20 | 52 | 12 | 60 | 4  |
| 30 | 38 | 22 | 46 | 14 | 54 | 6  | 62 |
| 35 | 27 | 43 | 19 | 51 | 11 | 59 | 3  |
| 31 | 39 | 23 | 47 | 15 | 55 | 7  | 63 |
| 34 | 26 | 42 | 18 | 50 | 10 | 58 | 2  |
| 32 | 40 | 24 | 48 | 16 | 56 | 8  | 64 |
| 33 | 25 | 41 | 17 | 49 | 9  | 57 | 1  |
—321
FIG. 12
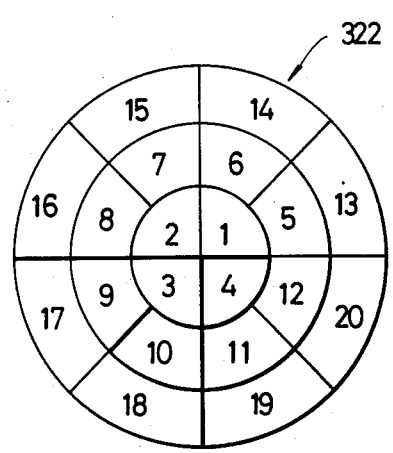
FIG. 13
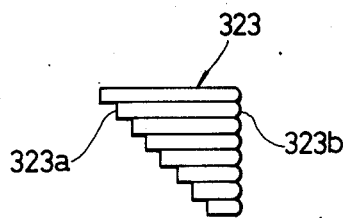
FIG. 14
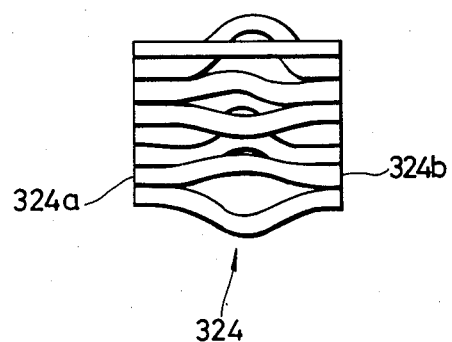

ILLUMINATION OPTICAL ARRANGEMENT

BACKGROUND OF THE INVENTION

1. Field of the Invention

This invention relates to an illumination arrangement for supplying a uniform illuminating light of high brightness, and in particular to an arrangement for rendering the coherency of illumination suitable.

2. Description of the Prior Art

In an apparatus for effecting the photolithography used for the manufacture of semiconductors such as VLSI, it is necessary to effect uniform illumination of high brightness, and generally a super-high pressure mercury lamp is used for such illumination and an elliptical reflecting mirror is often used for condensing the illumination. Recently, however, a higher degree of integration of VLSI has become desired and not only the uniformity of the illumination but also illumination of higher brightness has become necessary. A laser is known as a light source of high brightness, but the laser has strong coherency and therefore forms interference fringes on the illuminated object surface and thus has been disadvantageous for uniform illumination.

In an imaging optical system, it is necessary to make the coherency of illumination into a suitable value in order to obtain a necessary resolving power, and it is known to control the σ value (the ratio of the numerical aperture of the illuminating system to the numerical aperture of the objective lens) for this purpose. Where a coherent light source such as laser light is an illuminating light source, the light source is condensed into a spot and it is scanned at the pupil position of the imaging optical system by a suitable size, whereby the required coherency can be obtained. However, where the area to be scanned is great, the optical system for scanning becomes bulky and there is also a disadvantage that the time required for the scanning is long.

SUMMARY OF THE INVENTION

It is an object of the present invention to provide an illumination optical arrangement which uses a coherent light source such as a laser and yet can accomplish illumination excellent in uniformity.

It is another object of the present invention to provide an illuminating light source of compact construction and high brightness for supply incoherent illumination from a coherent light.

According to an embodiment of the present invention, there is provided an illumination optical arrangement having a light source, means for scanning the light beam from the light source, and optical means for forming a plurality of secondary light sources from the scanned light beam at spatially different positions, and forming an incoherent light source substantially enlarged by the scanning means and the optical means.

In another embodiment of the present invention, means for providing optical path differences between the optical paths corresponding to secondary light sources is provided between the coherent light source and said optical means. Specifically, the light beam from the coherent light source is separated into a plurality of optical paths and directed onto the surfaces of the secondary light sources and the optical path length is made different for each optical path, and this optical path length difference is made greater than the coherent distance. By having made said optical path length differ, it is preferable to adjust the transmission factor for each optical path in order to correct the non-uniformity of transmission factor caused between said plurality of optical paths.

BRIEF DESCRIPTION OF THE DRAWINGS

FIGS. 11 and 12 are plan views showing further examples of the staircase prism.

FIG. 13 is a side view showing a modification of the staircase prism.

FIG. 14 is a side view of an optical fiber.

DESCRIPTION OF THE PREFERRED EMBODIMENTS

Figure 1:
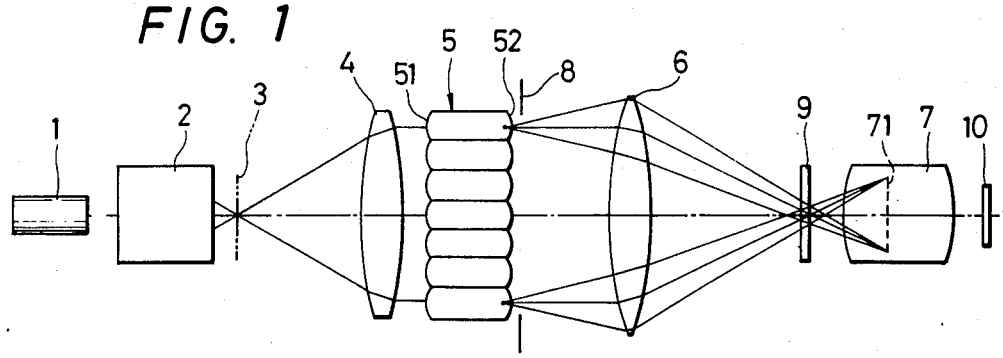
FIG. 1 shows the optical construction of a projection exposure apparatus according to a first embodiment of the present invention.
Figure 2:
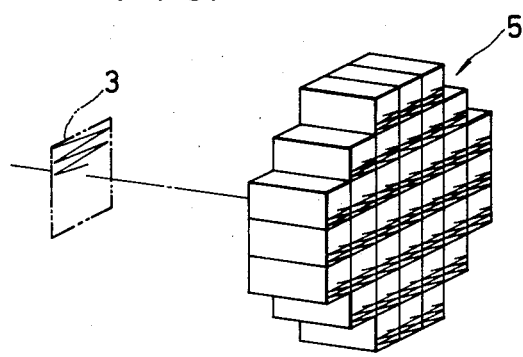
FIG. 2 is a perspective view of a fly-eye lens.

Referring to FIG. 1, there is shown a first embodiment which is applied to a projection type exposure apparatus for projecting the pattern of a photomask onto a semiconductor wafer. A coherent light supplied from a laser light source 1 is condensed into a spot by a scanning optical device 2 and also is two-dimensionally scanned on a scanning surface 3. The light beam from the scanning surface 3 is collimated by a collimater lens 4 having its focus on the scanning surface 3 and enters a fly-eye lens 5. The fly-eye lens 5 comprises a number of square pole lens elements joined together as shown in FIG. 2, and the opposite end surfaces of each lens element are formed into convex spherical surfaces and have the function of a positive lens. The focal length of the entrance surface 51 of each lens element is substantially equal to the length of this lens element, i.e., the thickness of the fly-eye lens, and therefore, the collimated light beam entering the fly-eye lens is condensed by each lens element and a spot image is formed near the exit surface 52 of each lens element. Accordingly, when the scanning surface 3 is scanned by a spot light by means of the scanning optical device 2 as depicted in FIG. 2, all spot images are scanned with a locus similar in shape to the locus on the scanning surface, on the exit surface of each lens element. That is, a number of spot images are scanned at a time by the entire exit surface of the fly-eye lens 5. As a result, an enlarged large incoherent light source surface is formed on the exit surface of the fly-eye lens. At a certain moment, a plurality of coherent light sources are formed on the exit surface of the fly-eye lens, but actually, optical aberrations are present and therefore, at the next moment, the relative phase difference between the lights from those light sources considerably varies and substantially, the plurality of coherent light sources can be regarded as being incoherent to one another.

The spot image of the exit surface of the fly-eye lens is formed on the pupil plane 71 of a projection objective lens 7 by a condenser lens 6. Here is achieved the so-called Kaler illumination. The pattern on a photomask 9 is projected onto a wafer 10 by the projection objective lens 7. An aperture stop 8 is provided near the exit surface of the fly-eye lens, and by changing the diameter of this stop, the N.A. of the illuminating system, i.e., the size of the light source image on the pupil plane 71 of the projection objective lens, can be changed and illumination of any $\sigma$ value can be accomplished.

Figure 3:
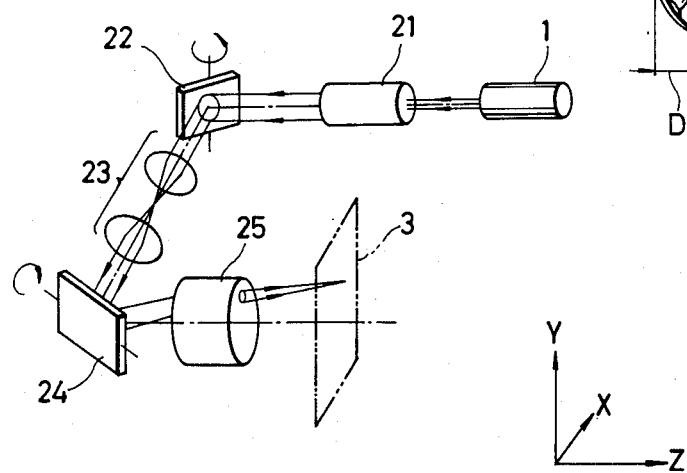
FIG. 3 is a perspective view of a scanning optical device used in the first embodiment.

A specific example of the construction of the scanning optical device 2 is shown in FIG. 3. The light beam from the laser light source 1 has its diameter expanded by a beam expander 21, enters a first turnable mirror 22 having a pivot in the Y-axis direction and is reflected thereby, whereafter it passes through an afocal lens system 23 and enters a second turnable mirror 24 having a pivot in a direction orthogonal to the Y-axis. The light beam reflected by the second turnable mirror 24 passes through a condensing lens 25 and is condensed on the scanning surface 3. By the first and second turnable mirrors being turned, the scanning surface 3 is scanned in X and Y directions by a spot light. The mirrors 22 and 24 may be constructed as conventional polygon mirrors. It is also effective that the two mirrors are constructed at conjugate positions with respect to the afocal lens system 23.

Figure 4:
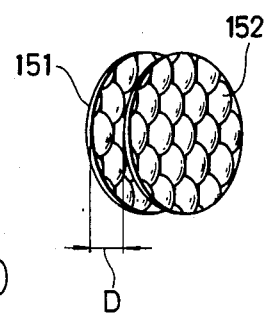
FIG. 4 is a perspective view showing another example of the fly-eye lens.

Even when the scanning by a spot light is effected by independent scanning in each of X and Y directions as in the present embodiment, a plane light source substantially approximate to a circular shape can be formed because the fly-eye lens is formed as a bundle of numerous lens elements, and thus efficient illumination is possible. The fly-eye lens 5 comprises a combination of square pole lens elements as described above, whereas this is not restrictive, but the fly-eye lens may also be formed by hexagonal pole or octagonal pole lens elements. As a further alternative, the fly-eye lens may be formed by two lenticular lenses 151 and 152, as shown in FIG. 4. In this case, the spacing D between the lenticular lenses should desirably be substantially equal to the focal length of the incident light side lenticular lens 151, and a substantially enlarged incoherent light source surface is formed on the emergent light side lenticuar lens 152. At this time, the emergent light side lenticular lens 152 has the function as a field lens and performs the function of enhancing the illumination efficiency, but it is not always necessary. These lenticular lenses should desirably have a shape substantially approximate to a circle and can be easily made of transparent plastics.

In FIG. 1, the fly-eye lens 5 is shown particularly large relative to the photomask to make the embodiment readily understood, but the size of the fly-eye lens is arbitrarily determined in accordance with the necessary size as a plane light source, and the size and number of the lens elements forming the fly-eye lens are arbitrarily determined as required. Also, the collimater lens 4 may be eliminated where the numerical aperture (N.A.) of the light beam supplied from the scanning optical device 2.

Figure 5:
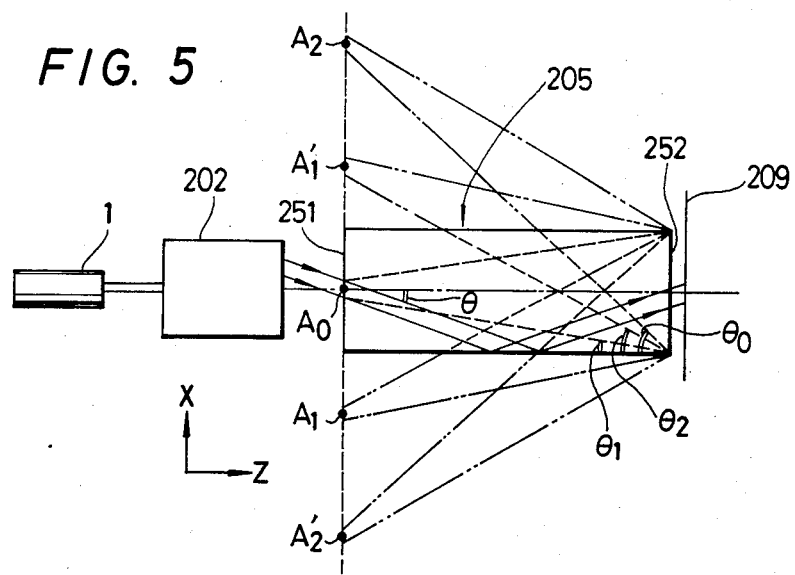
FIG. 5 is an optical path view showing the construction of a second embodiment of the present invention.
Figure 6:
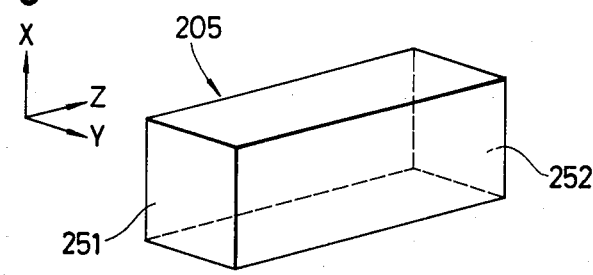
FIG. 6 is a perspective view of a post-like member.

In a second embodiment of the present invention shown in FIG. 5, a post-like member formed of a transparent substance is used as optical means forming an incoherent light source. The coherent light from a laser light source 1 is enlarged into a predetermined beam diameter by a scanning optical device 202 and is periodically deflected in X-Z plane over a predetermined angle range and enters the post-like member 205. The post-like member is constructed of a square pole glass block as shown in FIG. 6, but alternatively, it may be a post-like block having other bottom surface shape. A reflection film is deposited by evaporation on each side surface of the post-like member 205 so as to effect inner surface reflection, and the light beam entering the post-like member 205 is reflected by the inner surface of each side of the post-like member 205 and emerges from the exit surface 252 thereof. FIG. 5 shows the state of the light beam in X-Z plane when the Z-axis is plotted in the direciton of the optic axis. The light beam collimated by the scanning optical device 202 rotates about the center point $A_0$ of the entrance surface 251, and the angle $\theta$ which the light beam forms with the optic axis in X-Z plane continuously varies in the range of $+\theta_0 \sim 0 \sim -\theta_0$.

Description will now be made of a case where the angle of inclination $\theta$ of the parallel light beam varies to $0-\theta_0$ clockwisely. Up to $0-\theta_1$, the parallel light beam is not reflected by the side surface but directly reaches the exit surface 252. In the case of $\theta_1-\theta_2$, the parallel light beam is inner-surface-reflected by the lower side surface and reaches the exit surface and therefore, in this range, the light beam is supplied from an area centered at a point $A_1$ symmetrical with the point $A_0$ with respect to the lower side surface. In the case of greater angles of $\theta_2-\theta_0$, the light beam is reflected by the lower side surface and thereafter reflected also by the upper side surface and therefore, the light beam is supplied from an area centered at a point $A_2$ symmetrical with the point $A_1$ with respect to the upper side surface. On the other hand, where the angle of inclination $\theta$ of the parallel light beam varies to $0-\theta_0$ counter-clockwisely, the light beam directly reaches the exit surface in the range of $0-\theta_1$, and in the ranges of $\theta_1-\theta_2$ and $\theta_2-\theta_0$, the light beam reaches the exit surface so that it is supplied from a point $A_1'$ symmetrical with the point $A_0$ with respect to the upper side surface and from a point $A_2'$ symmetrical with the point $A_1'$ with respect to the lower side surface. Accordingly, when the angle of the light beam entering the post-like member 205 is varied to $0 \rightarrow +\theta_0 \rightarrow 0 \rightarrow -\theta_0 \rightarrow 0$ for one period, the light beam is supplied from the points $A_1$, $A_2$, $A_1$, $A_0$, $A_1'$, $A_2'$, $A_1'$ and $A_0$ in succession and substantially, the light beam becomes supplied from a very large light source. This state is likewise formed also in Y-Z plane orthogonal to X-Z plane. Thus, the object surface 209 near the exit surface is subjected to substantially incoherent illumination by a very large light source. In such incoherent illumination, the numerical aperture of the light beam reaching the object surface is determined by the maximum angle of inclination of the light beam.

In the above-described embodiment, the center of rotation $A_0$ may be disposed in spaced apart relationship with the entrance surface. The center of rotation of the light beam deflected in X-Z plane and the center of rotation of the light beam deflected in Y-Z plane need not be made coincident with each other.

By the photomask 9 of FIG. 1 being disposed on the object surface 209, the light beam can be used as the illuminating light source of the projection exposure apparatus. Since the substantial light source surface lies at the point $A_0$, it is desirable that the entrance pupil of the projection objective lens be formed near this point $A_0$. Also, where a condenser lens is inserted between the post-like member 205 and the photomask, it is desirable that the entrance pupil of the projection objective lens and the point $A_0$ be conjugate with respect to the condenser lens.

Figure 7:
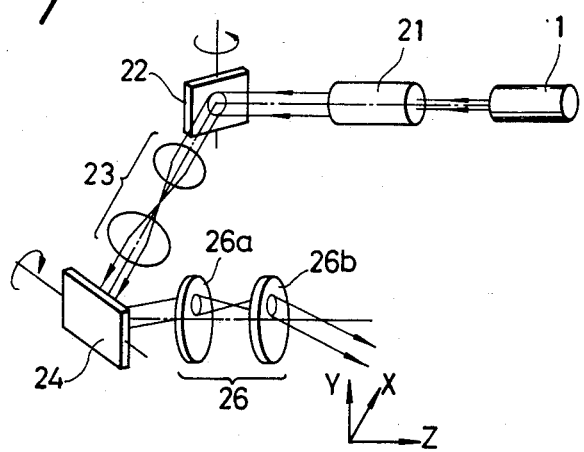
FIG. 7 is a perspective view of a scanning optical device used in the second embodiment.

FIG. 7 shows an example of the scanning optical device used in the second embodiment. This device is basically identical to the device shown in FIG. 3, but differs from the device of FIG. 3 in that a so-called Kepler type afocal lens system 26 is used instead of the condensing lens 25. The light beam reflected by a second turnable mirror 24 enters the afocal lens system 26 and emerges therefrom without being condensed, and is deflected in a predetermined angle range in accordance with the turning of the first and second turnable mirrors 22 and 24.

In the scanning optical device of each of the above-described embodiments, it is not always necessary to enlarge the diameter of the light beam from the laser light source by a beam expander, but incoherent illumination can be sufficiently accomplished also by varying the angle of emergence of the light beam from the laser light source and causing the light beam to immediately enter the fly-eye lens or the post-like member.

Figure 8:
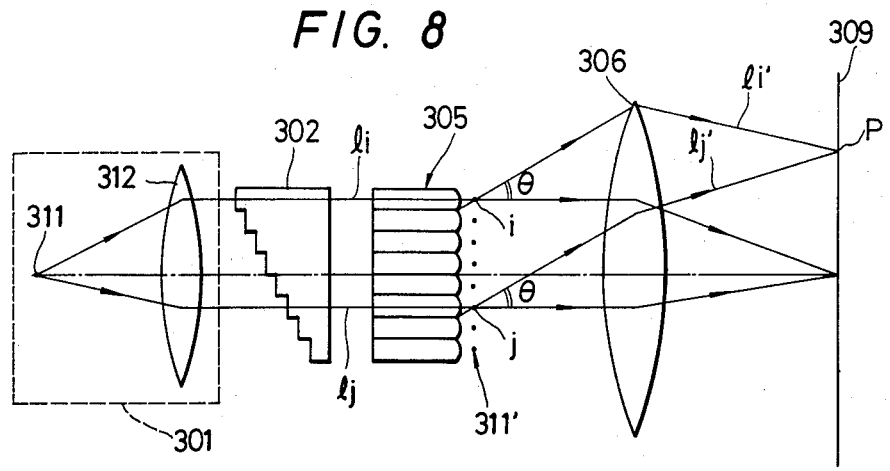
FIG. 8 is an optical path view illustrating the principle of a third embodiment of the present invention.

In FIG. 8, there is shown a third embodiment in which the light beam from a coherent light source is separated into a plurality of optical paths having different optical path lengths and directed onto a secondary light source surface.

A coherent parallel light beam supplied from a light source 301 is transmitted through a staircase prism 302, whereafter it forms a plurality of secondary light sources 311' near the exit surface of a lenticular lens 305 by the lenticular lens. The light beams from the plurality of secondary light sources superposedly illuminate the object surface 309 by a condenser lens 306. The coherent light source 301 is equivalent to a state in which a point source of light 311 is collimated by a positive lens 312 and therefore, for convenience, it is shown as a point source of light. The lenticular lens 305 is comprised of eight juxtaposed lens blocks, and eight secondary light sources are formed by the respective lens blocks. The staircase prism 302 has eight steps to create different optical path lengths for each optical path corresponding to each lens block of the lenticular lens 305, and creates optical path differences for the eight secondary light sources, respectively.

Here, let it be assumed that the optical path length from the point source of light 311 to an arbitrary point i on the secondary light source is li and the optical path length from this point i on the secondary light source to an arbitrary point P on the object surface 309 is li'. The point P on the object surface is illuminated from each of the plurality of secondary light sources and therefore, when with respect to another arbitrary point j different from the point i on the secondary light source, the optical path length from the point source of light 311 is lj and the optical path length to the point P on the object surface is lj', the optical path difference $\Delta l$ between the optical paths passing through the two points i and j on the secondary light source 311' to the point P on the object surface is expressed as $$\Delta l = (li + li') - (lj + lj') \qquad (1).$$

Where this optical path difference $\Delta l$ is greater than the coherent distance L determined by the light from the coherent light source, no interference occurs at the point P on the object surface depending on the light beams from the pair of points i and j on the secondary light source. Accordingly, where, for the arbitrary two points i and j on the secondary light source and also for the arbitrary point P on the illuminated object area, the condition that $$|(li + li') - (lj + lj')| > L \qquad (2)$$

is satisfied, it is possible to avoid the formation of interference fringes on the illuminated object area.

Assuming that the pair of points i and j are adjacent to each other on the secondary light source, and rewriting the aforementioned equaiton (1), the optical path difference $\Delta l$ is expressed as $$\Delta l = (li - lj) + (li' - lj').$$

The first term of the rightside of this equation corresponds to the optical path difference created by the staircase prism 302 and therefore, assuming that each level difference of the staircase prism is S, the optical path difference created thereby is expressed as $(n-1) \cdot S$, where n is the refractive index of the staircase prism, and with regard to the adjacent points i and j, $$(li - lj) = (n-1) \cdot S.$$

Also, if the spacing between the adjacent lens blocks of the lenticular lens 305 is d and the numerical aperture thereof is NA, the optical path difference from the secondary light source to the marginal edge of the illuminated object is expressed as $d \cdot NA$, and $$(li' - lj') = d \cdot NA.$$

The numerical aperture NA of the lenticular lens is defined by $\sin \theta$ if the angle of emergence thereof is $2\theta$. Accordingly, the condition of equation (2) is $$|(n-1) \cdot S + d \cdot NA| > L.$$

Consequently, the optical path difference for each optical path to be created by the staircase prism is given as $$(n-1) \cdot S > d \cdot NA + L \qquad (3).$$

For the prism block spaced apart by m, it is necessary that the condition that $$(n-1) \cdot m \cdot S > m \cdot d \cdot NA + L$$

be satisfied, and it is apparent that this condition will necessarily be satisfied if equation (3) is satisfied.

It is desirable that the above-mentioned condition be strictly satisfied, but where a number of secondary light sources are formed by the lenticular lens, even if interference fringes by a pair or several pairs of points on the secondary light source are formed at an arbitrary point on the illuminated object area, such interference fringes are weak relative to the intensity of light as a whole and therefore, substantially sufficient uniform illumination is possible in practice. In this case, the positions of the interference fringes on the object surface created by the several pairs of points on the secondary light source may be random in the illuminated area.

The details of the coherent distance are described in Max Born and Emil Wolf, *Principles of Optics* (Fourth Edition), 7.5.8. (pp. 316–3323), Pergamon Press, Oxford, 1970, and when the central wavelength of the light beam supplied from the coherent light source is λ and the wavelength width is Δλ, the coherent distance L is given as $$L = \lambda^2/\Delta\lambda \qquad (4).$$

Figure 9:
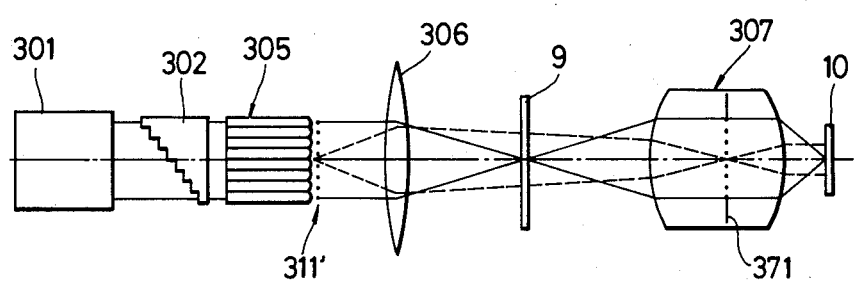
FIG. 9 shows the optical construction of the projection exposure apparatus according to the third embodiment.

An embodiment in which said illumination optical system is applied to a projection type exposure apparatus is shown in FIG. 9. The light beam from a secondary light source 311' is directed to a photomask 9 by a condenser lens 306. A predetermined pattern formed on the photomask is projected onto a wafer 10 by a projection objective lens 307. The image of the secondary light source 311' is formed on the entrance pupil of the projection objective lens, i.e., at the position of the stop 371 of the objective lens as shown, by a condenser lens 306, and so-called Kaler illumination is effected. In FIG. 9, the light rays showing the conjugate relation between the photomask and the wafer are indicated by solid lines and the light rays showing the conjugate relation of the secondary light source are indicated by dotted lines.

A staircase prism 302 has a refractive index n=1.5 and the value S of the level difference is 4.0 mm. It is to be understood that as the coherent light source 301, use is made of a rare gas bilide laser (XeCl) which is one of exima lasers. This XeCl rare gas halide laser supplies a coherent light beam having a central wavelength λ=308 nm and a wavelength width Δλ=0.5 nm. Accordingly, the coherent distance L of this coherent light beam is about 0.2 mm from equation (4). Also, assuming that the numerical aperture NA of a lenticular lens 305 is 0.2 and that the spacing d between adjacent lens blocks is 6.0 mm, the minimum value of the optical path difference of the staircase prism 302 given by the condition of equation (3) is 1.4 mm. Accordingly, the optical path difference $$(1.5-1) \times 4.0 \text{ mm} = 2.0 \text{ mm}$$

created by the staircase prism 302 is considerably greater than the minimum value of the optical path difference given by condition (3) and thus, it is possible to effect very uniform illumination without forming any interference fringe on the photomask.

Figure 10:
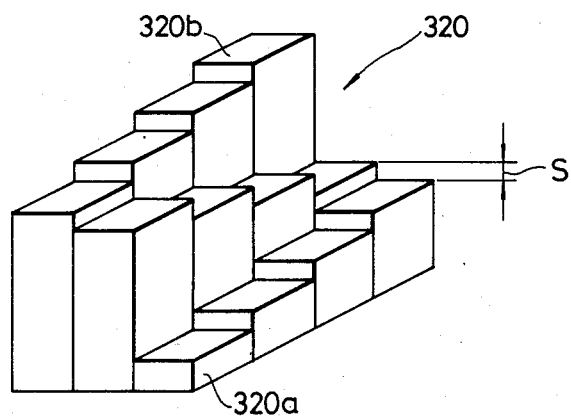
FIG. 10 is a perspective view showing a specific example of the staircase prism.

In the foregoing description, for simplicity, the three-dimensional construction has been mentioned with respect neither to the lenticular lens 305 nor to the staircase prism 302, but in practice, it is necessary to use a staircase prism 320 of a construction as shown, for example, in FIG. 10 and to use a three-dimensionally arranged lenticular lens. The staircase prism 320 is constructed of twelve square pole prisms different in length, and the shortest square pole prism 320a to the longest square pole prism 320b are successively arranged with the length increasing by S. In the correspondence with FIG. 9, the upper part of FIG. 10 is the incident light side and the lower part thereof is the emergent light side, but from the function of causing an optical path difference to occur, the front and back are not related, and it is important that each square pole prism of the staircase prism is disposed relative to the optical paths of the individual lens blocks of the lenticular lens.

The staircase prism of FIG. 10 has an inclination in the distribution of the lengths of the square pole prisms thereof and therefore, there is an undesirable possibility that irregularity of illumination is caused by the absorption of light in the prism. To avoid this, it is necessary to reduce the inclination of the length in the arrangement of the square pole prisms. In the staircase prism 321 shown in FIG. 11, numbers represent the order of the lengths of the square pole prisms. That is, in this case, every other prism is disposed in succession from the longest square pole prism, and the square pole prisms are arranged so that the longest square pole prism and the shortest square pole prism are adjacent to each other, whereby the uniformization of the distribution of the length as the whole staircase prism is achieved. In both of the examples of the staircase prism shown in FIGS. 10 and 11, the cross-sectional shape is a bundle of square post-like prism blocks, and this is because generally the projection pattern formed on a photomask is rectangular, and it is effective for the illumination of a rectangular area.

In the example of the staircase prism 322 shown in FIG. 12, post-like prisms of sector cross-sectional shape are spirally arranged in succession with the longest one as the center, and the numbers in this Figure represent the order of the lengths of the post-like prisms. In this case, the staircase prism is substantially rotation-symmetrical in accordance with the optical system generally constructed rotation-symmetrically and moreover, long post-like prisms are disposed in the central portion wherein a light beam of relatively high brightness is present, and this is more effective for uniform illumination.

Now, in the above-described embodiment, the staircase prism and the lenticular lens are separately constructed, but alternatively, these may be made integral with each other. FIG. 13 shows an example of such construction. The entrance surface 323a of the staircase prism 323 is formed on the staircase, and a lenticular lens having the function of a positive lens correspondingly to each prism block is formed on the exit surface 323b of the staircase prism.

The prism as described above is not restrictive, but use may also be made of an optical fiber 324 comprising a number of fiber bundles as shown in FIG. 14. In the example shown, the entrance surface 324a and the exit surface 324b of the optical fiber are arranged on the same plane and the length of each fiber bundle is changed in accordance with the necessary optical path difference. In order that the optical path difference may be created, each prism block may be constructed of optical materials different not only in length but also in refractive index. Further, in the above-described example, use has been made of a lenticular lens having the function of a positive lens, but a lenticular lens having the function of a negative lens can also be used and, in this case, the secondary light source is formed as a virtual image.

Figure 15:
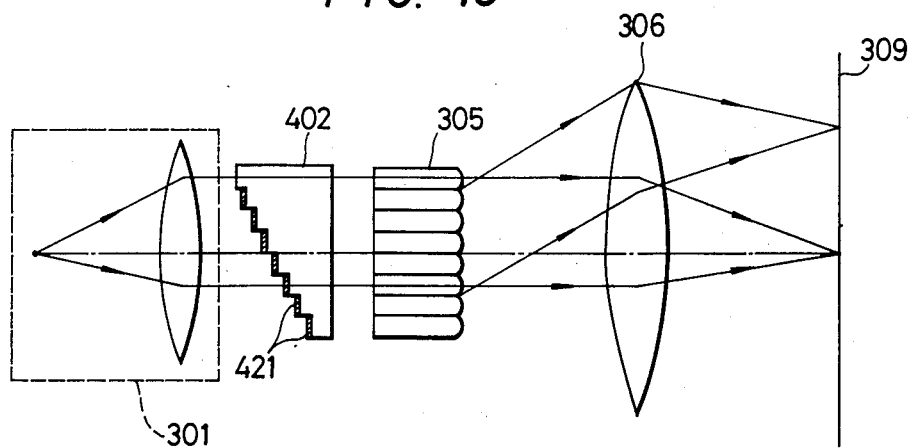
FIG. 15 is an optical path view showing the construction of a fourth embodiment of the present invention.

Another embodiment in which the irregularity of illumination based on the difference in optical path length in the staircase prism is improved is shown in FIG. 15. A partially light-transmitting layer 421 for adjusting the transmission factor of each prism block is provided on the entrance side end surface of the staircase prism 402. The partially light-transmitting layer 421 adjusts the transmission factors of the remaining blocks to make the transmission factor in each block of the staircase prism coincide with that of the block of the lowest transmission factor, i.e., the block of the greatest optical path length, and a dielectric material film, a magnetic material film, a metal film or a semiconductor film is attached to the staircase-like end surface of each prism block except the block of the greatest optical path length by a method such as evaporation. The loss of the quantity of light by the layer 421 can be minimized to make the transmission factor in each block coincide with that of the prism block of the lowest transmission factor.

Figure 16:
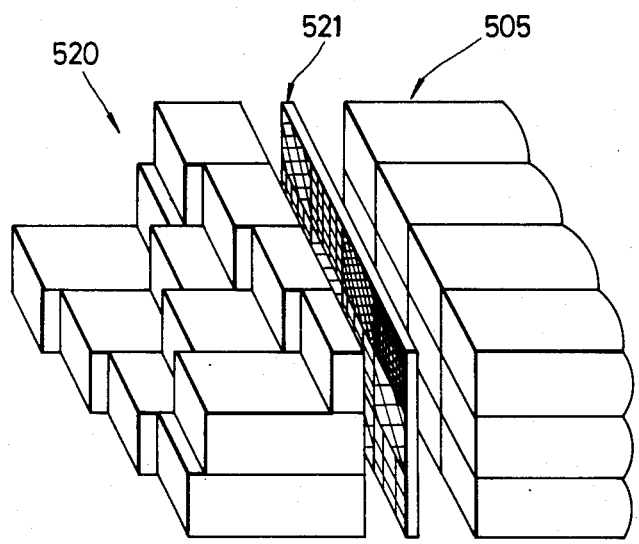
FIG. 16 is a perspective view showing a modification of the fourth embodiment.

As an alternative method for achieving the partial light transmission, a special filter may be provided as shown in FIG. 16.

The filter 521 is disposed between a staircase prism 520 and a lenticular lens 505. In this filter 521, areas having various transmission factors are planarly arranged in opposed relationship with the respective blocks of the staircase prism so as to uniformize the intensity of the light transmitted through the staircase prism. Accordingly, each light transmitted through each opposed area of the filter and has its intensity uniformized thereby, and enters the opposed lens element of the lenticular lens 505.

In addition to the above-described embodiment, each prism block of the staircase prism or each lens element of the lenticular lens may be formed by the use of optical materials different in transmission factor to thereby eliminate the irregularity of illumination.

We claim:

1. An illumination optical arrangement comprising:
   (a) light source means emitting a coherent light beam; and
   (b) means for forming a substantially incoherent light source from said coherent light beam, said incoherent light source forming means including means for periodically deflecting said coherent light beam and scanning a predetermined scanning area by said coherent light beam, and optical means for forming a plurality of optical paths for directing the coherent light beam passed through said predetermined scanning area to a plurality of different secondary scanning areas, each of said plurality of secondary scanning areas being scanned by said periodically deflected coherent light beam.

2. An illumination optical arrangement according to claim 1, wherein said optical means includes means for forming a plurality of images of said light source means at a time from said coherent light beam passed through said predetermined scanning area.

3. An illumination optical arrangement according to claim 2, wherein said optical means includes fly-eye lens means.

4. An illumination optical arrangement according to claim 1, wherein said optical means directs the coherent light beam passed through said predetermined scanning area to said plurality of secondary scanning areas in succession in accordance with the phase of the periodical deflection of said coherent light beam.

5. An illumination optical arrangement according to claim 4, wherein said optical means includes a light-transmitting post-like member havng an entrance surface opposed to said predetermined scanning area, an exit surface substantially parallel to said entrance surface, and a side surface connecting said entrance surface and said exit surface together, and said coherent light beam is inner-surface-reflected at a position corresponding to the phase of said side surface.

6. An illumination optical arrangement comprising:
   (a) light source means emitting a coherent light beam; and
   (b) means for forming a substantially incoherent light source from said coherent light beam, said incoherent light source forming means including optical means having a multiplicity of optical paths through which parts of said coherent light beam pass respectively and forming a multiplicity of corresponding secondary light sources, and optical path difference forming means provided between said light source means and said secondary light source forming optical means for making differences between the optical path lengths of said multiplicity of optical paths.

7. An illumination optical arrangement according to claim 6, wherein said optical path difference forming means includes an optical member provided with an entrance surface having a multiplicity of entrance areas through which parts of said coherent light beam passes respectively and an exit surface having a multiplicity of exit areas corresponding to said entrance areas, and the optical path lengths from said multiplicity of entrance areas to said multiplicity of exit areas differ from one another.

8. An illumination optical arrangement according to claim 7, wherein said optical member includes a staircase prism having a multiplicity of post-like prism elements in which the distances between the entrance surfaces and the exit surfaces differ from one another.

9. An illumination optical arrangement according to claim 7, wherein said optical member includes an optical fiber having a multiplicity of fiber bundles different in length.

10. An illumination optical arrangement according to claim 6, wherein said incoherent light source forming means further includes means for selectively adjusting the transmission factors of said optical paths to correct the difference in the transmission factor of said coherent light beam between said multiplicity of optical paths.

11. An illumination optical arrangement according to claim 10, wherein said adjusting means includes optical filter means acting so as to reduce the transmission factors of the optical paths having relatively short optical path lengths, of said multiplicity of optical paths.

12. An illumination optical arrangement in an apparatus for projecting a pattern on an object onto a projection surface by an objective lens, comprising:
   (a) light source means emitting a coherent light beam;
   (b) means for forming a substantially incoherent light source from said coherent light beam, said incoherent light source forming means including means for periodically deflecting said coherent light beam and scanning a predetermined scanning area by said coherent light beam, and optical means for forming a plurality of optical paths for directing the coherent light beam passed through said predetermined scanning area to a plurality of different secondary scanning areas, each of said plurality of secondary scanning areas being scanned by said periodically deflected coherent light beam; and
   (c) condensing lens means provided to direct the light beam passed through said plurality of secondary scanning areas to the pupil of said objective lens, said secondary scanning areas and the pupil of said objective lens being in a substantially conjugate relationship with respect to said condensing lens means.

* * * * *